United States Patent
Lung et al.

(10) Patent No.: US 9,578,746 B2
(45) Date of Patent: Feb. 21, 2017

(54) CIRCUIT BOARD AND ELECTRONIC DEVICE UTILIZING THE SAME

(71) Applicant: ScienBiziP Consulting (Shen Zhen) Co., Ltd., Shenzhen (CN)

(72) Inventors: Hsien-Pei Lung, New Taipei (TW); Wu-Zhe Yu, Shenzhen (CN)

(73) Assignee: ScienBiziP Consulting(Shenzhen)Co., Ltd., Shenzhen (CN)

( * ) Notice: Subject to any disclaimer, the term of this patent is extended or adjusted under 35 U.S.C. 154(b) by 69 days.

(21) Appl. No.: 14/695,936

(22) Filed: Apr. 24, 2015

(65) Prior Publication Data
US 2016/0270228 A1    Sep. 15, 2016

(30) Foreign Application Priority Data
Mar. 9, 2015    (CN) .......................... 2015 1 0101797

(51) Int. Cl.
*H05K 1/00*     (2006.01)
*H05K 1/11*     (2006.01)
*H05K 1/02*     (2006.01)
*H05K 5/00*     (2006.01)

(52) U.S. Cl.
CPC ............. *H05K 1/115* (2013.01); *H05K 1/0215* (2013.01); *H05K 5/0026* (2013.01); *H05K 2201/09272* (2013.01)

(58) Field of Classification Search
CPC .. H05K 1/0286; H05K 1/0287; H05K 1/0289; H05K 1/0292; H05K 1/0293; H05K 1/0206; H05K 1/0221; H05K 1/0222; H05K 1/0225; H05K 1/0251; H05K 1/112; H05K 1/115; H05K 1/116; H05K 2201/09063; H05K 2201/09072; H05K 2201/092; H05K 2201/095; H05K 2201/09509; H05K 2201/09518; H05K 2201/09527; H05K 2201/09536; H05K 2201/09545; H05K 2201/09554; H05K 2201/09581; H05K 2201/096; H05K 2201/09609; H05K 2201/09618; H05K 2201/09627; H05K 2201/09809; H05K 2201/09818; H05K 2201/09827; H05K 2201/09836; H05K 2201/09845; H05K 2201/09854; H05K 2201/09863; H05K 3/4061; H05K 3/4069; H05K 2201/037; H05K 2201/0959; H05K 2201/09645; H05K 2201/10666; H05K 3/4046; H05K 3/42; H05K 3/421; H05K 3/429; H01L 23/5226
See application file for complete search history.

(56) References Cited

U.S. PATENT DOCUMENTS

| 7,557,302 B2 * | 7/2009 | Wang ..................... H05K 1/026 174/255 |
| 2010/0289596 A1 * | 11/2010 | Makino .................. H01P 5/085 333/32 |
| 2012/0318852 A1 * | 12/2012 | Zhou ..................... H05K 9/0039 228/180.21 |

\* cited by examiner

*Primary Examiner* — Angel R Estrada
*Assistant Examiner* — Pete Lee
(74) *Attorney, Agent, or Firm* — Zhigang Ma

(57) ABSTRACT

A circuit board includes a substrate defining a plurality of ground attaching holes and a plurality of first through-holes. The substrate includes a first surface and a side edge. Wherein, a plurality of parallel and spaced first conductive paths is formed on the first surface around each ground attaching hole. A first arcuate conductive portion is formed at each end of each first conductive path. An angle between each first conductive path and the side edge is 45° or 135°. The first through-holes respectively extend through the first arcuate conductive portions and electrically couple with the first conductive paths.

13 Claims, 4 Drawing Sheets

CIRCUIT BOARD AND ELECTRONIC DEVICE UTILIZING THE SAME

FIELD

The subject matter herein generally relates to a circuit board.

BACKGROUND

Ground attaching holes are defined in a printed circuit board (PCB) for conductive screws to extend through to attach the PCB to an enclosure of an electronic device. Generally, two annular pads are formed at two opposite ends of each ground attaching hole contacting with the screw and the enclosure to allow the PCB to be grounded.

BRIEF DESCRIPTION OF THE DRAWINGS

Implementations of the present technology will now be described, by way of example only, with reference to the attached figures.

DETAILED DESCRIPTION

Figure 1:
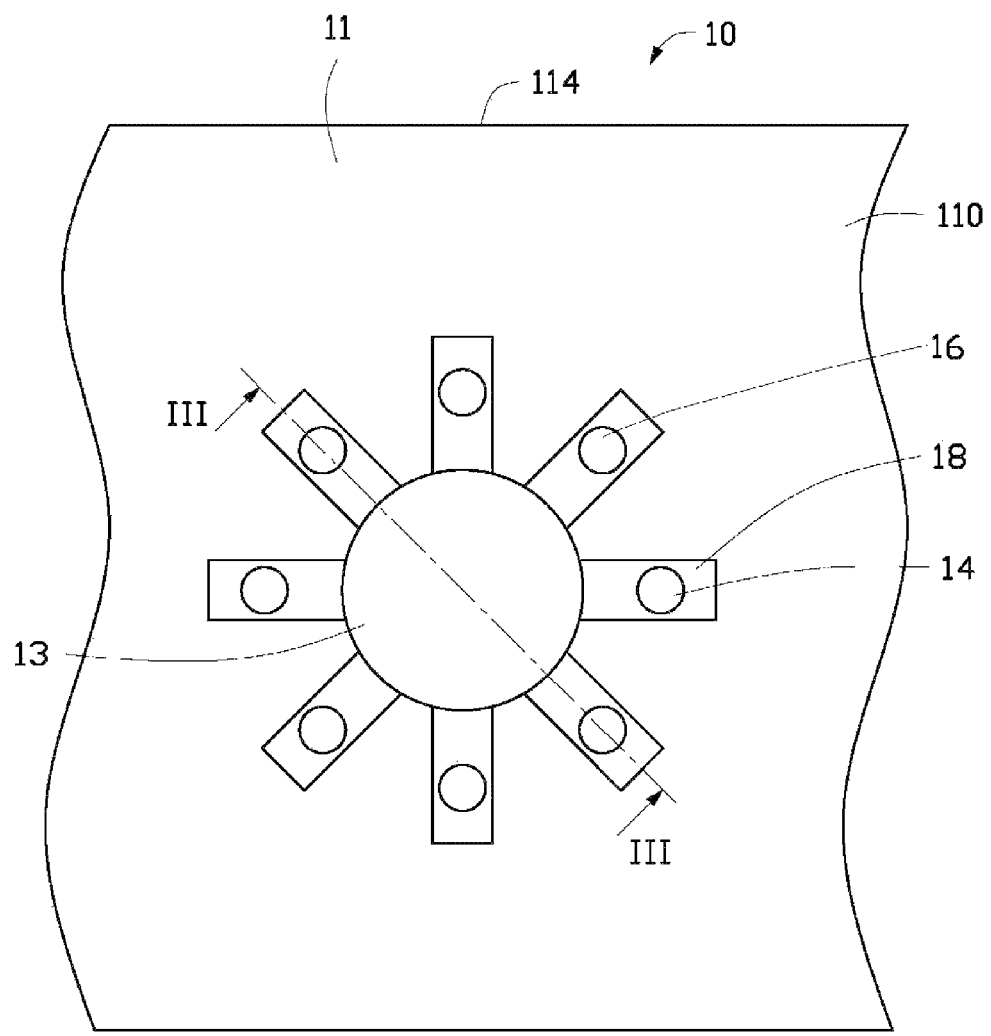
FIG. 1 is a diagrammatic view of the top of an embodiment of a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as coupled, whether directly or indirectly through intervening components, and is not necessarily limited to physical connections. The connection can be such that the objects are permanently coupled or releasably coupled. The term "comprising" means "including, but not necessarily limited to"; it specifically indicates open-ended inclusion or membership in a so-described combination, group, series and the like.

The present disclosure describes an electronic device.

Figure 4:
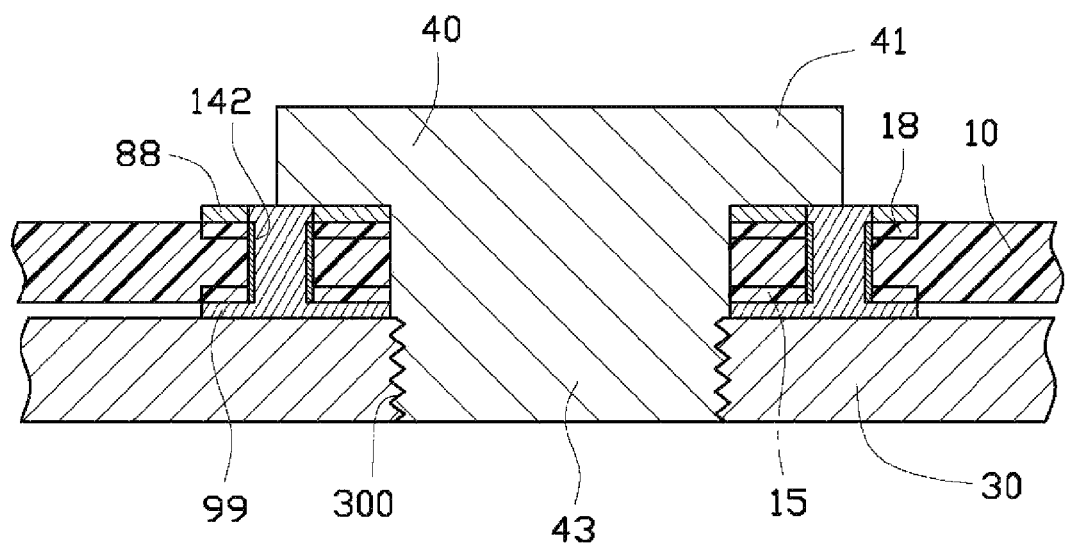
FIG. 4 is a cross sectional view of an assembly of the circuit board of FIG. 1, a fixing member, and an enclosure taken along line III-III, wherein the circuit board is soldered.

FIG. 4 illustrates that an embodiment of the electronic device comprises a circuit board 10, an enclosure 30, and a plurality of fixing members 40. In at least one embodiment, the circuit board 10 is a printed circuit board (PCB).

Figure 2:
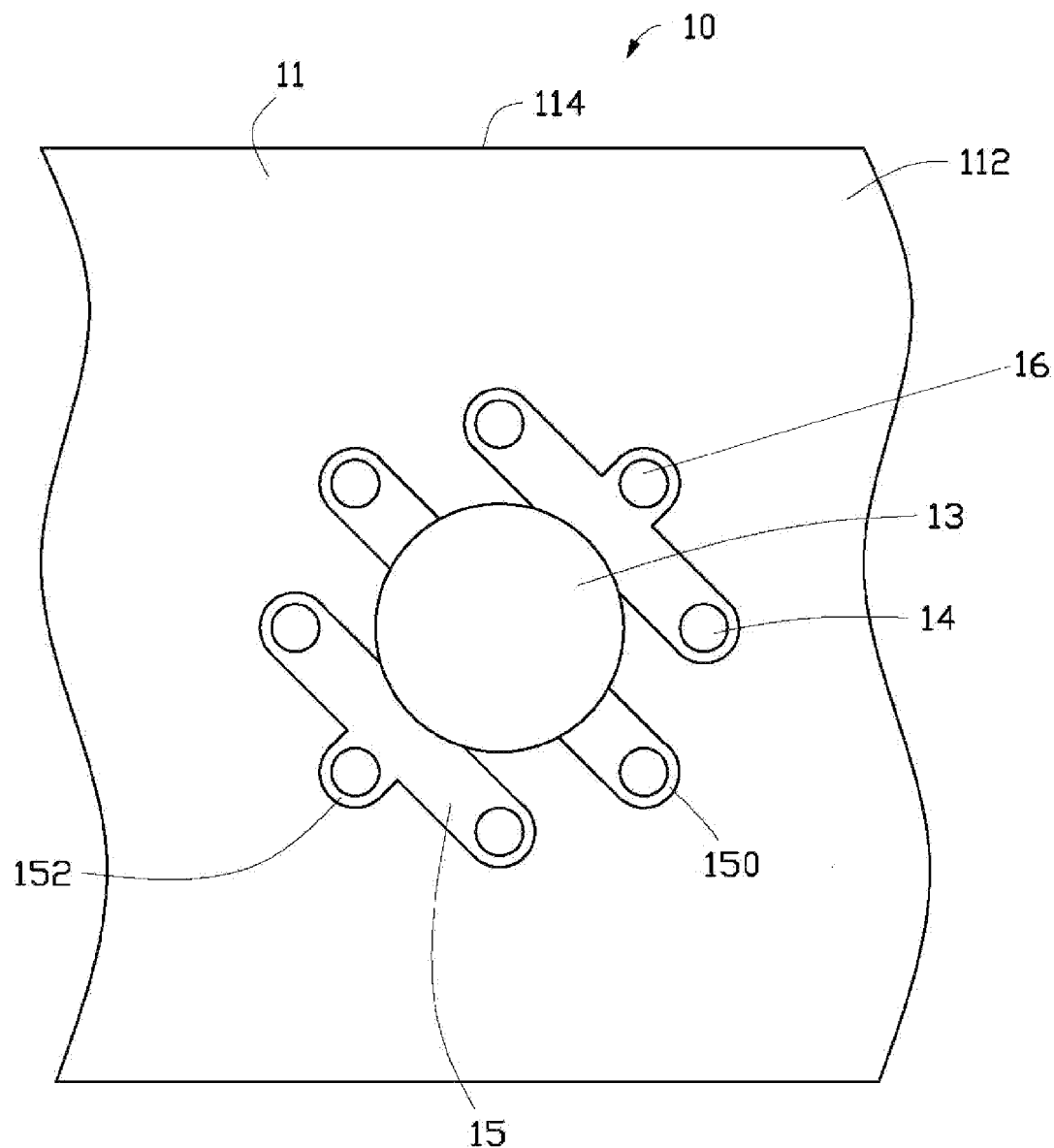
FIG. 2 is a diagrammatic view of the bottom of the circuit board of FIG. 1.

FIGS. 1 and 2 illustrate the circuit board 10. The circuit board 10 comprises a substrate 11. The substrate 11 has a first surface 112, a second surface 110 opposite and substantially parallel to the first surface 112, and a side edge 114. The substrate 11 defines a plurality of spaced ground attaching holes 13 extending through the second surface 110 and the first surface 112. Each ground attaching hole 13 has an interior surface extending from a first ground attaching hole edge at the first surface 112 through to a second ground attaching hole edge at the second surface 110.

A plurality of parallel and spaced first conductive paths 15 is formed at the first surface 112, around each ground attaching hole 13. Each first conductive path 15 is angled with the side edge 114. In at least one embodiment, an angle between each first conductive path 15 and the side edge 114 is 45°. A first arcuate conductive portion 150 is formed at each end of each first conductive path 15. A second arcuate conductive portion 152 is formed at a middle of an outer side of each of the two outermost first conductive paths 15. In the embodiment, the first arcuate conductive portions 150 and the second arcuate conductive portions 152 are semicircular.

A plurality of second conductive paths 18 is circularly formed on the second surface 110, around an center of each ground attaching hole 13. A plurality of first through-holes 14 and a plurality of second through-holes 16 are defined in the substrate 11. Each of the first through-holes 14 and the second through-holes 16 has an interior surface extending from a first through-hole edge at the first surface 112 through to a second through-hole edge at the second surface 110. The first through-holes 14 extend through the first arcuate conductive portions 150 and the second conductive paths 18 and are electrically coupled with the first conductive paths 15 and the second conductive paths 18. The second through-holes 16 extend through the second arcuate conductive portions 152 and the second conductive paths 18 and are electrically coupled with the first conductive paths 15 and the second conductive paths 18.

The interior surfaces of the first through-holes 14 and the second through-holes 16 are coated with conductive coatings 142, such as copper. In at least one embodiment, the number of the first through-holes 14 is six and the number of the second through-holes 16 is two.

The enclosure 30 defines a plurality of threaded fixing holes 300, corresponding to the ground attaching holes 13 of the circuit board 10.

Each fixing member 40 is a screw made of conductive material and comprises a head portion 41 and a threaded post 43 extending from an end of the head portion 41.

Figure 3:
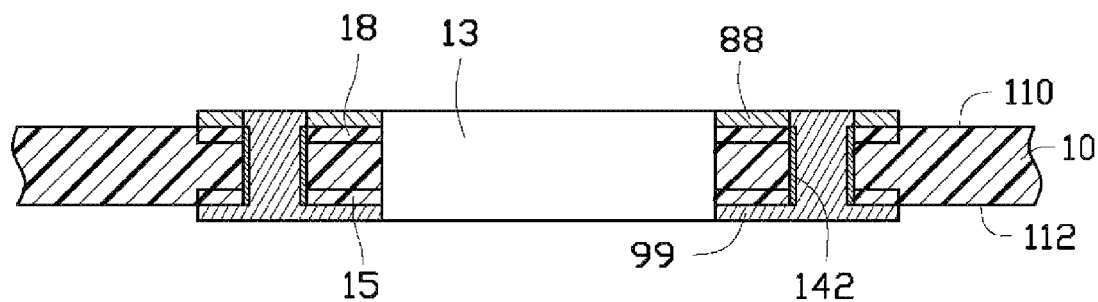
FIG. 3 is a cross sectional view of the circuit board of FIG. 1 taken along line III-III, wherein the circuit board is soldered.

FIG. 3 illustrates the circuit board 10 is soldered. A conductive layer 88 is formed on the second conductive paths 18 by reflow solder. A conductive layer 99 is formed on the first conductive paths 15 by wave solder and each of the first through-holes 14 and the second through-holes 16 is filled with solder.

In assembly, the posts 43 of the fixing members 40 extend through the ground attaching holes 13 to engage in the fixing holes 300 of the enclosure 30. The head portions 41 of the fixing members 40 abut against the conductive layer 88 and the conductive layer 99 abuts against the enclosure 30 to allow the circuit board 10 to be grounded.

The angle between each first conductive path 15 and the side edge 114 can be 45° or 135°, allowing that the thickness of the conductive layer 99 remains the same whether the circuit board 10 is placed parallel or perpendicular to the side edge 114. The first arcuate conductive portions 150 and the second arcuate conductive portions 152 are semicircular which prevents solder from piling up at two opposite ends of the first conductive paths 15. The conductive layer 99 is evenly distributed for steady contact with the enclosure 30 to keep the circuit board 10 well grounded.

The embodiments shown and described above are only examples. Many details are often found in the art such as the other features of a circuit board and an electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A circuit board comprising:
a substrate defining a plurality of ground attaching holes and a plurality of first through-holes, the substrate comprising a first surface and a side edge;
wherein a plurality of parallel and spaced first conductive paths is formed on the first surface around each ground attaching hole, and a first arcuate conductive portion is formed at each end of each first conductive path, an angle between each first conductive path and the side edge is 45° or 135°, and the first through-holes extend through the first arcuate conductive portions and electrically couple with the first conductive paths.

2. The circuit board of claim 1, wherein at least one second arcuate conductive portion is formed at an outer side of each of the outermost first conductive paths, the substrate further defines a plurality of second through-holes extending though the second arcuate conductive portions and electrically coupling with the first conductive paths.

3. The circuit board of claim 2, wherein the first and second arcuate conductive portions are semicircular.

4. The circuit board of claim 2, wherein each of the first through-holes and the second through-holes has an interior surface extending from a first through-hole edge at the first surface through to a second through-hole edge at the second surface, the interior surfaces of the first and second through-holes are coated with conductive coating to electrically couple with the first conductive paths and the second conductive paths.

5. The circuit board of claim 4, wherein the substrate further has a second surface opposite to the first surface, a plurality of second conductive paths is circularly formed on the second surface around an center of each ground attaching hole, the first and the second through-holes extend through the second conductive paths and electrically couple with the second conductive paths.

6. An electronic device comprising:
an enclosure;
a plurality of conductive fixing members each comprising a head portion and a threaded post extending from an end of the head portion; and
a circuit board comprising a substrate defining a plurality of ground attaching holes and a plurality of first through-holes, the substrate comprising a first surface, a second surface opposite to the first surface, and a side edge;
wherein a plurality of parallel and spaced first conductive paths is formed on the first surface around each ground attaching hole, and a plurality of second conductive paths is formed on the second surface around an center of each ground attaching hole;
wherein a first arcuate conductive portion is formed at each end of each first conductive path, an angle between each first conductive path and the side edge is 45° or 135°, the first through-holes extend through the first arcuate conductive portions and the second conductive paths and electrically couple with the first conductive paths and the second conductive paths, conductive layers are formed on the first and second conductive paths, the first through-holes are filled with solders;
wherein, the fixing members extend through the ground attaching holes to engage in the enclosure, the head portions abut against the conductive layer formed on the second conductive paths, the conductive layer formed on the first conductive paths abuts against the enclosure.

7. The electronic device of claim 6, wherein at least one second arcuate conductive portion is formed at an outer side of each of the outermost first conductive paths, a plurality of second through-holes extends though the second arcuate conductive portions and electrically couples with the second conductive paths.

8. The electronic device of claim 6, wherein the second conductive paths are circularly distributed around the center of the ground attaching hole.

9. The electronic device of claim 7, wherein the first and second arcuate conductive portions are semicircular.

10. The electronic device of claim 7, wherein each of the first through-holes and the second through-holes has an interior surface extending from a first through-hole edge at the first surface through to a second through-hole edge at the second surface, the interior surfaces of the first and second through-holes are coated with conductive coating to electrically couple with the first conductive paths and the second conductive paths.

11. A circuit board comprising:
a substrate having a first surface, a second surface, and a side edge, the second surface being opposite, and substantially parallel, to the first surface;
wherein, a plurality of ground attaching holes is defined in the substrate, with each ground attaching hole having an interior surface extending from a first ground attaching hole edge at the first surface through to a second ground attaching hole edge at the second surface;
wherein, surrounding each ground attaching hole, a plurality of first through-holes and a plurality of second through-holes are defined in the substrate, with each of the plurality of first through-holes and the plurality of second through-holes having an interior surface extending from a first through-hole edge at the first surface through to a second through-hole edge at the second surface, and the interior surface of each of the plurality of first through-holes and the plurality of second through-holes has a conductive coating;
wherein, a plurality of parallel and spaced first conductive paths is formed on the first surface around each ground attaching hole, with a first arcuate conductive portion formed at each end of each first conductive path, and an angle between each first conductive path and the side edge is 45° or 135°, and the plurality of first through-holes extends through the first arcuate conductive portions, and the conductive coatings of the plurality of first through-holes electrically contact with the first arcuate conductive portions;

wherein, a plurality of second conductive paths is formed on the second surface around each ground attaching hole, and the plurality of first through-holes and the plurality of second through-holes extend through the plurality of second conductive paths, and the conductive coatings of the plurality of first through-holes and the plurality of second through-holes electrically contact with the plurality of second conductive paths.

12. The circuit board of claim 11, wherein at least one second arcuate conductive portion is formed at an outer side of each of the outermost first conductive paths, the plurality of second through-holes extends though the second arcuate conductive portions and electrically couples with the first conductive paths.

13. The circuit board of claim 12, wherein the first and second arcuate conductive portions are semicircular.

* * * * *